United States Patent
Zhang

(10) Patent No.: US 10,181,841 B1
(45) Date of Patent: Jan. 15, 2019

(54) VOLTAGE LEVEL CONVERSION CIRCUIT AND DISPLAY PANEL

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Xianming Zhang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/575,675

(22) PCT Filed: Nov. 8, 2017

(86) PCT No.: PCT/CN2017/109825
§ 371 (c)(1),
(2) Date: Nov. 20, 2017

(30) Foreign Application Priority Data

Oct. 11, 2017 (CN) .......................... 2017 1 0940323

(51) Int. Cl.
*G09G 1/00* (2006.01)
*H03K 3/356* (2006.01)
*G09G 3/20* (2006.01)

(52) U.S. Cl.
CPC .......... *H03K 3/356017* (2013.01); *G09G 3/20* (2013.01); *G09G 2300/0871* (2013.01); *G09G 2310/0289* (2013.01)

(58) Field of Classification Search
CPC ............. G09G 1/00; G09G 2300/0842; G09G 2300/0861; G09G 3/325; G09G 3/2022; G09G 5/10; G06F 1/00
See application file for complete search history.

(56) References Cited

U.S. PATENT DOCUMENTS

2016/0125809 A1* 5/2016 Hwang ..................... G02F 1/13
345/212

* cited by examiner

*Primary Examiner* — Michael Faragalla
(74) *Attorney, Agent, or Firm* — Kirton McConkie; Evan R. Witt

(57) ABSTRACT

A voltage level conversion circuit includes a first voltage level input terminal, a second voltage level input terminal, a first thin film transistor, a second thin film transistor, and a delay control chip configured to output the first voltage level before outputting the second voltage level in a delayed manner. The present disclosure also provides a display panel.

17 Claims, 3 Drawing Sheets

VOLTAGE LEVEL CONVERSION CIRCUIT AND DISPLAY PANEL

BACKGROUND

1. Field of the Invention

The present disclosure relates to a display technology, and more particularly, to a voltage level conversion circuit and a display panel.

2. Description of the Related Art

With the technical development, users of display devices are highly critical of device functions. The display quality of a display panel is highly affected by the stability of conversion of high and low voltage levels of the pixel unit in the display panel.

When the voltage level of a scanning signal of the pixel unit is converted from high to low or from low to high, time-delay conversion and conversion voltage bias may exist in the converted low-voltage-level voltage or the converted high-voltage-level voltage because of a resistor device arranged in the corresponding display panel, thereby affecting the image display quality of the corresponding display panel.

Therefore, to solve the problem of the related art, it is necessary to provide a new voltage level conversion circuit and a display panel with the voltage level conversion circuit.

SUMMARY

An object of the present disclosure is to propose a voltage level conversion circuit which is capable of accurately and quickly converting high and low voltage levels and a display panel. With the voltage level conversion circuit and the display panel, the technical problem that time-delay conversion and conversion voltage bias possibly exist in the voltage-level voltage of the converted voltage level conversion circuit and the converted display panel of the related art is well solved.

According to a first aspect of the present disclosure, a voltage level conversion circuit includes a first voltage level input terminal configured to receive a first voltage level, a second voltage level input terminal configured to receive a second voltage level, a first thin film transistor, a second thin film transistor and a delay control chip configured to control the voltage level conversion output terminal such that the voltage level conversion output terminal outputs the first voltage level before outputting the second voltage level in a delayed manner. A polarity of the first voltage level is same as a polarity of the second voltage level, and an absolute voltage value of the first voltage level is more than an absolute voltage value of the second voltage level.

An input terminal of the first thin film transistor is coupled to the first voltage level input terminal, an output terminal of the first thin film transistor is coupled to a voltage level conversion output terminal, and a control terminal of the first thin film transistor is coupled to a first output terminal of the delay control chip. An input terminal of the second thin film transistor is coupled to the second voltage level input terminal, an output terminal of the second thin film transistor is coupled to the voltage level conversion output terminal, and a control terminal of the second thin film transistor is coupled to a second output terminal of the delay control chip.

In the voltage level conversion circuit, the first voltage level is a first high voltage level, and the second voltage level is a second high voltage level.

In the voltage level conversion circuit, the first voltage level is a first low voltage level, and the second voltage level is a second low voltage level.

In the voltage level conversion circuit, the delay control chip comprises a delay control circuit, a comparator, a first AND gate circuit, a NOT gate circuit, and a second AND gate circuit. The delay control circuit is configured to, at a rising edge or a falling edge of a clock signal, output a first control signal, and after a predetermined time period, output a second control signal. A non-inverting input terminal of the comparator is coupled to an output terminal of the delay control circuit, an inverting input terminal of the comparator is coupled to a reference signal, an output terminal of the comparator is coupled to a first input terminal of the first AND gate circuit, and an input terminal of the NOT gate circuit. A second input terminal of the first AND gate circuit is coupled to the clock signal, and an output terminal of the first AND gate circuit is coupled to the first thin film transistor. An output terminal of the NOT gate circuit is coupled to a first input terminal of the second AND gate circuit. A second input terminal of the second AND gate circuit is coupled to the clock signal, and an output terminal of the second AND gate circuit is coupled to the second thin film transistor.

In the voltage level conversion circuit, a polarity of the first control signal is opposite to a polarity of the second control signal.

In the voltage level conversion circuit, the first control signal is a low voltage level signal, and the second control signal is a high voltage level signal.

According to a second aspect of the present disclosure, a voltage level conversion circuit includes a first voltage level input terminal configured to receive a first voltage level with a high voltage level, a second voltage level input terminal configured to receive a second voltage level, a third voltage level input terminal configured to receive a third voltage level with a low voltage level, a fourth voltage level input terminal configured to receive a fourth voltage level, a first thin film transistor, a second thin film transistor, a third thin film transistor, a fourth thin film transistor, and a delay control chip. A polarity of the first voltage level is same as a polarity of the second voltage level, and an absolute voltage value of the first voltage level is more than an absolute voltage value of the second voltage level. A polarity of the third voltage level is same as a polarity of the fourth voltage level, an absolute voltage value of the third voltage level is more than an absolute voltage value of the fourth voltage level, and the polarity of the first voltage level is opposite to the polarity of the third voltage level. An input terminal of the first thin film transistor is coupled to the first voltage level input terminal, an output terminal of the first thin film transistor is coupled to a voltage level conversion output terminal, and a control terminal of the first thin film transistor is coupled to a first output terminal of a delay control chip. An input terminal of the second thin film transistor is coupled to the second voltage level input terminal, an output terminal of the second thin film transistor is coupled to the voltage level conversion output terminal, and a control terminal of the second thin film transistor is coupled to a second output terminal of the delay control chip. An input terminal of the third thin film transistor is coupled to the third voltage level input terminal, an output terminal of the third thin film transistor is coupled to the voltage level conversion output terminal, and a control terminal of the third thin film transistor is coupled to a third output terminal of the delay control chip. An input terminal of the fourth thin film transistor is coupled to the fourth voltage level input terminal, an output terminal of the fourth thin film transistor is coupled to the voltage level conversion output terminal, and a control terminal of the fourth thin film transistor is coupled to a fourth output terminal of the delay control chip. The delay control chip is configured to control the voltage level conversion output terminal such that the voltage level conversion output terminal outputs the first voltage level before outputting the second voltage level in a delayed manner, and configured to control the voltage level conversion output terminal such that the voltage level conversion output terminal outputs the third voltage level before outputting the fourth voltage level in a delayed manner.

In the voltage level conversion circuit, the delay control chip comprises a first delay circuit comprising a first delay control circuit, a first comparator, a first AND gate circuit, a first NOT gate circuit, and a second AND gate circuit. The first delay control circuit is configured to, at a rising edge of a clock signal, output a first control signal, and after a first predetermined time period, output a second control signal. A non-inverting input terminal of the first comparator is coupled to an output terminal of the first delay control circuit, an inverting input terminal of the first comparator is coupled to a reference signal, an output terminal of the first comparator is coupled to a first input terminal of the first AND gate circuit, and an input terminal of the first NOT gate circuit. A second input terminal of the first AND gate circuit is coupled to the clock signal, and an output terminal of the first AND gate circuit is coupled to the first thin film transistor. An output terminal of the first NOT gate circuit is coupled to a first input terminal of the second AND gate circuit. A second input terminal of the second AND gate circuit is coupled to the clock signal, and an output terminal of the second AND gate circuit is coupled to the second thin film transistor.

In the voltage level conversion circuit, the delay control chip comprises a second delay circuit. The second delay circuit comprises a second delay control circuit, a second comparator, a third AND gate circuit, a second NOT gate circuit, and a fourth AND gate circuit. The second delay control circuit is configured to, at a falling edge of a clock signal, output a first control signal, and after a second predetermined time period, output a second control signal. A non-inverting input terminal of the second comparator is coupled to an output terminal of the second delay control circuit, an inverting input terminal of the second comparator is coupled to a reference signal, an output terminal of the second comparator is coupled to a first input terminal of the third AND gate circuit, and an input terminal of the second NOT gate circuit. A second input terminal of the third AND gate circuit is coupled to the clock signal, and an output terminal of the third AND gate circuit is coupled to the third thin film transistor. An output terminal of the second NOT gate circuit is coupled to a first input terminal of the fourth AND gate circuit. A second input terminal of the fourth AND gate circuit is coupled to the clock signal, and an output terminal of the fourth AND gate circuit is coupled to the fourth thin film transistor.

In the voltage level conversion circuit, a polarity of the first control signal is opposite to a polarity of the second control signal.

In the voltage level conversion circuit, the first control signal is a low voltage level signal, and the second control signal is a high voltage level signal.

According to a third aspect of the present disclosure, a display panel includes a driving circuit. The driving circuit includes a first voltage level input terminal configured to receive a first voltage level, a second voltage level input terminal configured to receive a second voltage level, a first thin film transistor, a second thin film transistor and a delay control chip configured to control the voltage level conversion output terminal such that the voltage level conversion output terminal outputs the first voltage level before outputting the second voltage level in a delayed manner. A polarity of the first voltage level is same as a polarity of the second voltage level, and an absolute voltage value of the first voltage level is more than an absolute voltage value of the second voltage level. An input terminal of the first thin film transistor is coupled to the first voltage level input terminal, an output terminal of the first thin film transistor is coupled to a voltage level conversion output terminal, and a control terminal of the first thin film transistor is coupled to a first output terminal of the delay control chip. An input terminal of the second thin film transistor is coupled to the second voltage level input terminal, an output terminal of the second thin film transistor is coupled to the voltage level conversion output terminal, and a control terminal of the second thin film transistor is coupled to a second output terminal of the delay control chip In the display panel, the first voltage level is a first high voltage level, and the second voltage level is a second high voltage level.

In the display panel, the first voltage level is a first low voltage level, and the second voltage level is a second low voltage level.

In the display panel, the delay control chip comprises a delay control circuit, a comparator, a first AND gate circuit, a NOT gate circuit, and a second AND gate circuit. The delay control circuit is configured to, at a rising edge or a falling edge of a clock signal, output a first control signal, and after a predetermined time period, output a second control signal. A non-inverting input terminal of the comparator is coupled to an output terminal of the delay control circuit, an inverting input terminal of the comparator is coupled to a reference signal, an output terminal of the comparator is coupled to a first input terminal of the first AND gate circuit, and an input terminal of the NOT gate circuit. A second input terminal of the first AND gate circuit is coupled to the clock signal, and an output terminal of the first AND gate circuit is coupled to the first thin film transistor. An output terminal of the NOT gate circuit is coupled to a first input terminal of the second AND gate circuit. A second input terminal of the second AND gate circuit is coupled to the clock signal, and an output terminal of the second AND gate circuit is coupled to the second thin film transistor.

In the display panel, a polarity of the first control signal is opposite to a polarity of the second control signal.

In the display panel, the first control signal is a low voltage level signal, and the second control signal is a high voltage level signal.

In the present disclosure, a plurality of voltage-level inputs and a plurality of delay control chips are arranged in the voltage level conversion circuit and the display panel. The conversion voltage-level voltage is driven at a transition of the voltage level to ensure the accurate voltage-level voltage within the shortest period of time after conversion and increase the speed and accuracy of the voltage-level conversion. In this way, the technical problem that time-delay conversion and conversion voltage bias exist in the converted voltage-level voltage of the converted voltage level conversion circuit and the converted display panel of the related art is solved successfully.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE PREFERRED EMBODIMENTS

Figure 1:
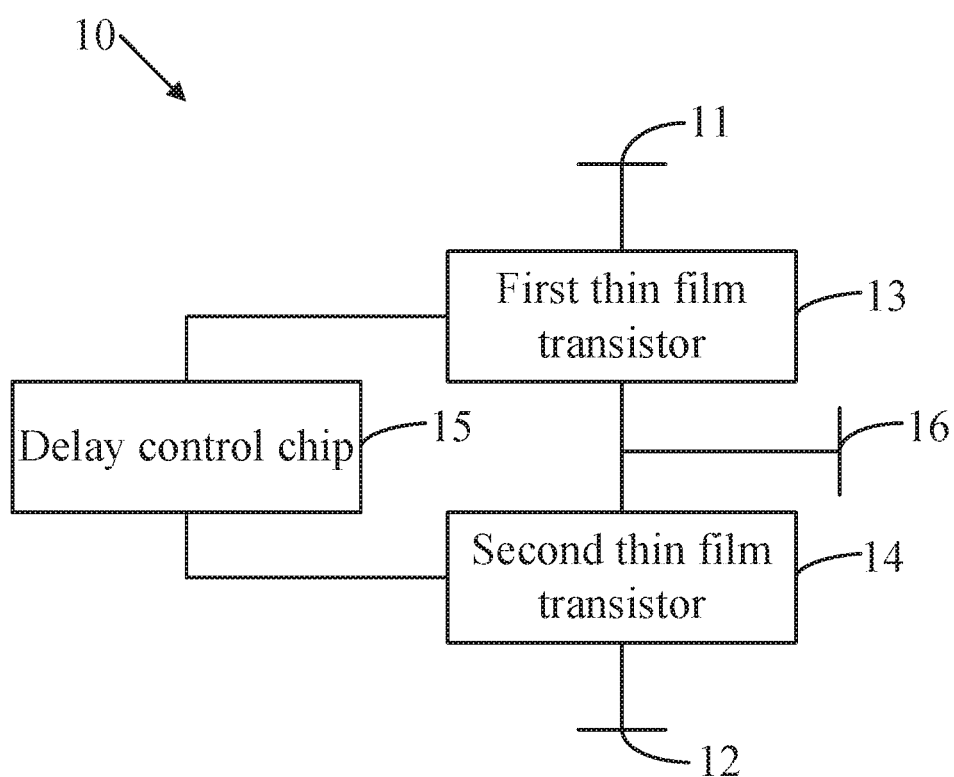
FIG. 1 illustrates a voltage level conversion circuit according to a first embodiment of the present disclosure.

Embodiments of the present application are illustrated in detail in the accompanying drawings, in which like or similar reference numerals refer to like or similar elements or elements having the same or similar functions throughout the specification. The embodiments described below with reference to the accompanying drawings are exemplary and are intended to be illustrative of the present application, and are not to be construed as limiting the scope of the present application.

Please refer to FIG. 1 illustrating a voltage level conversion circuit 10 according to a first embodiment of the present disclosure. The voltage level conversion circuit 10 includes a first voltage level input terminal 11 configured to receive a first voltage level, a second voltage level input terminal 12 configured to receive a second voltage level, a first thin film transistor 13, a second thin film transistor 14 and a delay control chip 15.

A polarity of the first voltage level is same as a polarity of the second voltage level, and an absolute voltage value of the first voltage level is greater than an absolute voltage value of the second voltage level.

An input terminal of the first thin film transistor 13 is coupled to the first voltage level input terminal 11, an output terminal of the first thin film transistor 13 is coupled to a voltage level conversion output terminal 16, and a control terminal of the first thin film transistor 13 is coupled to a first output terminal of the delay control chip 15. An input terminal of the second thin film transistor 14 is coupled to the second voltage level input terminal 12, an output terminal of the second thin film transistor 14 is coupled to the voltage level conversion output terminal 16, and a control terminal of the second thin film transistor 14 is coupled to a second output terminal of the delay control chip 15. The delay control chip 15 controls the voltage level conversion output terminal 16 to output a first voltage level before outputting the second voltage level.

The delay control chip 15 controls the first thin film transistor 13 to be turned on and the second thin film transistor 14 to be turned off such that the first voltage level with the greater absolute voltage value is outputted through the voltage level conversion output terminal 16. Subsequently, the delay control chip 15 controls the first thin film transistor 13 to be turned off and the second thin film transistor 14 to be turned on such that the second voltage level with the greater absolute voltage value is outputted through the voltage level conversion output terminal 16. The voltage level conversion output terminal 16 may rapidly and accurately the second voltage level because the absolute voltage value of the first voltage level is greater than the absolute voltage value of the second voltage level.

The delay control chip 15 includes a delay control circuit, a comparator, a first AND gate circuit, a NOT gate circuit, and a second AND gate circuit.

The delay control circuit is configured to, at a rising edge or a falling edge of a clock signal, output a first control signal corresponding to the first voltage level, and after a predetermined time period, output a second control signal corresponding to the second voltage level. A polarity of the first control signal is opposite to a polarity of the second control signal, e.g., the first control signal is a low voltage level signal, and the second control signal is a high voltage level signal.

A non-inverting input terminal of the comparator is coupled to an output terminal of the delay control circuit. An inverting input terminal of the comparator is coupled to a reference signal. An output terminal of the comparator is coupled to a first input terminal of the first AND gate circuit and an input terminal of the NOT gate circuit. The comparator outputs a first comparing signal according to the first control signal and a reference signal, and outputs a second comparing signal according to the second control signal and a reference signal.

A second input terminal of the first AND gate circuit is coupled to the clock signal, and an output terminal of the first AND gate circuit is coupled to the first thin film transistor. The first AND gate circuit outputs a first switching signal to turn on and turn off the first thin film transistor in response to the first comparing signal and the second comparing signal.

An output terminal of the NOT gate circuit is coupled to a first input terminal of the second AND gate circuit. The NOT gate circuit performs an NOT operation on the first comparing signal and the second comparing signal to generate an inverted first comparing signal and an inverted second comparing signal.

A second input terminal of the second AND gate circuit is coupled to the clock signal, and an output terminal of the second AND gate circuit is coupled to the second thin film transistor. The second AND gate circuit outputs a second switching signal to turn on and turn off the second thin film transistor in response to the inverted first comparing signal and the inverted second comparing signal.

Since the delay control circuit of the delay control chip outputs the first control signal and the second control signal that is a delay of the first control signal, the first AND gate circuit outputs the first switching signal to turn on and turn off the first thin film transistor exactly according to the first control signal, and the second AND gate circuit outputs the second switching signal to turn on and turn off the second thin film transistor exactly according to the second control signal.

In another embodiment, both the first thin film transistor and second thin film transistor are P-channel metal oxide semiconductor (MOS) transistors. At the rising edge of the clock signal, the delay control circuit outputs the first control signal with a low voltage level, the comparator and the first AND gate circuit output low voltage level to turn on the first thin film transistor. At this moment, the NOT gate circuit and the second AND gate circuit output high voltage level to turn off the second thin film transistor so that the first voltage level is outputted at the voltage level conversion output terminal 16.

After the predetermined time period, the delay control circuit outputs the first control signal with a high voltage level, the comparator and the first AND gate circuit output high voltage level to turn off the first thin film transistor. At this moment, the NOT gate circuit and the second AND gate circuit output low voltage level to turn on the second thin film transistor so that the second voltage level is outputted at the voltage level conversion output terminal 16.

In another embodiment, both the first thin film transistor and second thin film transistor are N-channel metal oxide semiconductor (MOS) transistors. At the falling edge of the clock signal, the delay control circuit outputs the first control signal with a high voltage level, the comparator and the first AND gate circuit output high voltage level to turn on the first thin film transistor. At this moment, the NOT gate circuit and the second AND gate circuit output low voltage level to turn off the second thin film transistor so that the first voltage level is outputted at the voltage level conversion output terminal 16.

After the predetermined time period, the delay control circuit outputs the first control signal with a low voltage level, the comparator and the first AND gate circuit output low voltage level to turn off the first thin film transistor. At this moment, the NOT gate circuit and the second AND gate circuit output high voltage level to turn on the second thin film transistor so that the second voltage level is outputted at the voltage level conversion output terminal 16.

The design of a comparator and an NOT gate circuit in the present disclosure makes sure that the signal strength of a first thin-film transistor (TFT) and a second TFT and raises the signal trigger promptness and signal accuracy of both of the TFT first and the second TFT.

Figure 2:
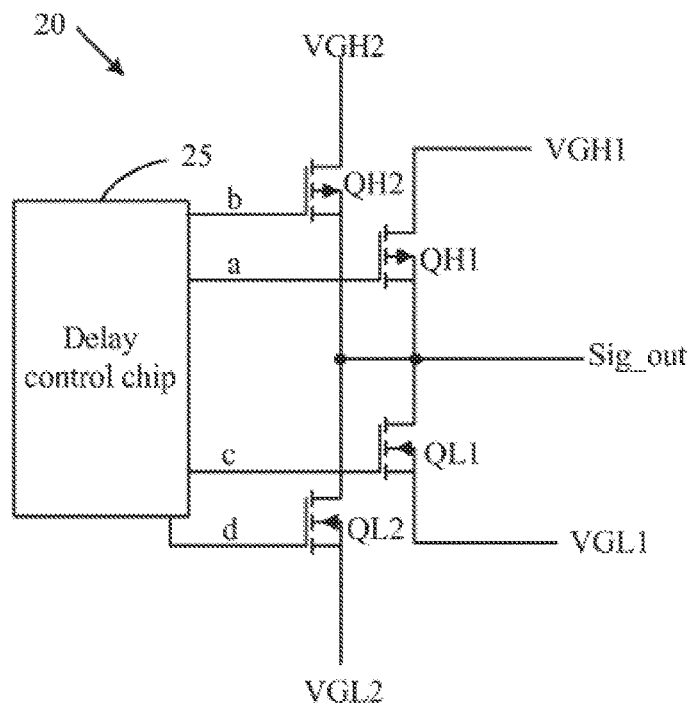
FIG. 2 illustrates a voltage level conversion circuit according to a second embodiment of the present disclosure.

Please refer to FIG. 2 illustrating a circuit diagram of a voltage level conversion circuit 20 according to another embodiment of the present disclosure. The voltage level conversion circuit 20 includes a first voltage level input terminal configured to receive a first voltage level, a second voltage level input terminal configured to receive a second voltage level, a third voltage level input terminal configured to receive a third voltage level, a fourth voltage level input terminal configured to receive a fourth voltage level, a first thin film transistor QH1, a second thin film transistor QH2, a third thin film transistor QL1, a fourth thin film transistor QL2 and a delay control chip 25.

The first voltage level VGH1 is a high voltage level. A polarity of the first voltage level VGH1 is same as a polarity of the second voltage level VGH2, and an absolute voltage value of the first voltage level VGH1 is more than an absolute voltage value of the second voltage level VGH2.

An input terminal of the first thin film transistor QH1 is coupled to the first voltage level input terminal, an output terminal of the first thin film transistor QH1 is coupled to a voltage level conversion output terminal Sig_out, and a control terminal of the first thin film transistor QH1 is coupled to a first output terminal a of a delay control chip 25. An input terminal of the second thin film transistor QH2 is coupled to the second voltage level input terminal, an output terminal of the second thin film transistor QH2 is coupled to the voltage level conversion output terminal Sig_out, and a control terminal of the second thin film transistor QH2 is coupled to a second output terminal b of the delay control chip 25.

The third voltage level VGL1 is a low voltage level. A polarity of the third voltage level VGL1 is same as a polarity of the fourth voltage level VGL2. An absolute voltage value of the third voltage level VGL1 is greater more than an absolute voltage value of the fourth voltage level VGL2.

An input terminal of the third thin film transistor QL1 is coupled to the third voltage level input terminal, an output terminal of the third thin film transistor QL1 is coupled to the voltage level conversion output terminal Sig_out, and a control terminal of the third thin film transistor QL1 is coupled to a third output terminal c of the delay control chip 25. An input terminal of the fourth thin film transistor QL2 is coupled to the fourth voltage level input terminal, an output terminal of the fourth thin film transistor QL2 is coupled to the voltage level conversion output terminal Sig_out, and a control terminal of the fourth thin film transistor QL2 is coupled to a fourth output terminal d of the delay control chip 25.

The delay control chip 25 is configured to control the voltage level conversion output terminal Sig_out to output the first high voltage level VGH1 before outputting the second high voltage level VGH2, and configured to control the voltage level conversion output terminal to output the third voltage level VGL1 before outputting the fourth voltage level VGL2.

Figure 3:
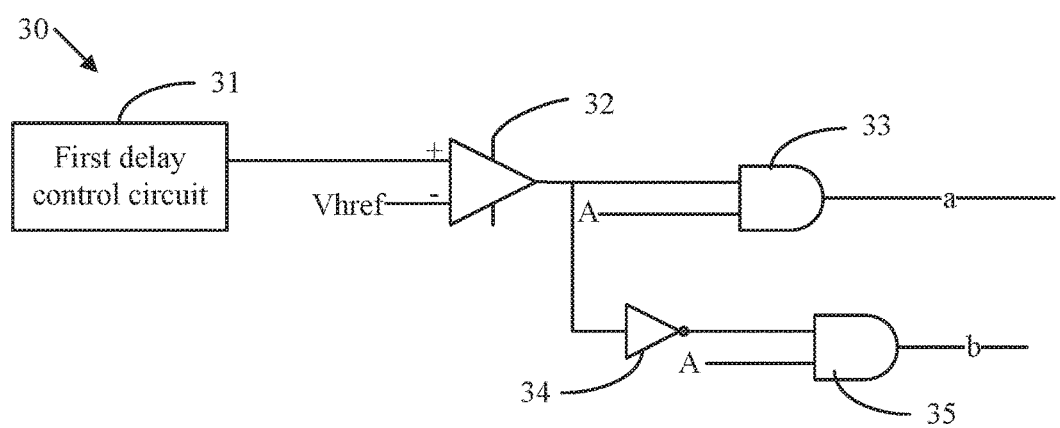
FIG. 3 illustrates a circuit diagram of the first delay circuit according to an embodiment of the present disclosure.
Figure 4:
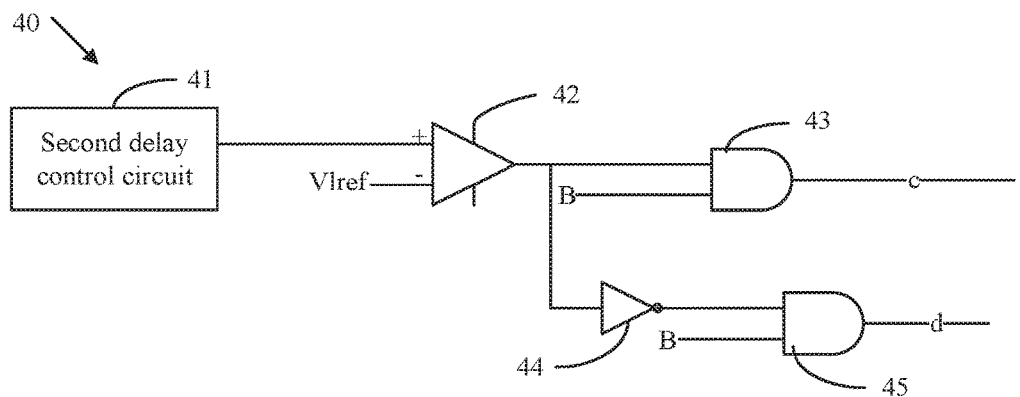
FIG. 4 illustrates a circuit diagram of the second delay circuit according to an embodiment of the present disclosure.

The delay control chip 25 comprises a first delay circuit 30 and a second delay control circuit 40. Please refer to FIG. 3 illustrating a circuit diagram of the first delay circuit 30 according to an embodiment of the present disclosure, and FIG. 4 illustrating a circuit diagram of the second delay circuit 40 according to an embodiment of the present disclosure.

The first delay circuit 30 comprises a first delay control circuit 31, a first comparator 32, a first AND gate circuit 33, a first NOT gate circuit 34, and a second AND gate circuit 35.

The first delay control circuit 31 is configured to, at a rising edge of a clock signal, output a first control signal, and after a first predetermined time period, output a second control signal. A polarity of the first control signal is opposite to a polarity of the second control signal.

A non-inverting input terminal of the first comparator 32 is coupled to an output terminal of the first delay control circuit 31, an inverting input terminal of the first comparator 32 is coupled to a reference signal Vhref, an output terminal of the first comparator 32 is coupled to a first input terminal of the first AND gate circuit 33, and an input terminal of the first NOT gate circuit 34.

The first comparator 32 is configured to output a first comparing signal in response to the first control signal and the reference signal Vhref and to output a second comparing signal according to the second control signal and the reference signal Vhref.

A second input terminal of the first AND gate circuit 33 is coupled to the clock signal, and an output terminal of the first AND gate circuit 33 is coupled to the first thin film transistor QH1. The first AND gate circuit 33 is configured to generate a first switching signal to turn on and turn off the first thin film transistor QH1 according to the first comparing signal, second comparing signal and clock signal.

An output terminal of the first NOT gate circuit 34 is coupled to a first input terminal of the second AND gate circuit 35. The first comparing signal is inverted to the second comparing by means of the first NOT gate circuit 34.

A second input terminal of the second AND gate circuit 35 is coupled to the clock signal, and an output terminal of the second AND gate circuit 35 is coupled to the second thin film transistor QH2. The second AND gate circuit 35 is configured to generate a second switching signal to turn on and turn off the second thin film transistor QH2 according to the second comparing signal and the second comparing signal that is inverted to the first comparing signal.

The second delay circuit 40 comprises a second delay control circuit 41, a second comparator 42, a third AND gate circuit 43, a second NOT gate circuit 44, and a fourth AND gate circuit 45.

The second delay circuit 41 is configured to, at a falling edge of a clock signal, output a third control signal corresponding to the third voltage level VGL1, and after a second predetermined time period, output a fourth control signal corresponding to the fourth voltage level VGL2.

A non-inverting input terminal of the second comparator 42 is coupled to an output terminal of the second delay control circuit 41, an inverting input terminal of the second comparator 42 is coupled to a reference signal Vlref, an output terminal of the second comparator 42 is coupled to a first input terminal of the third AND gate circuit 43, and an input terminal of the second NOT gate circuit 44.

The second comparator 42 is configured to output a third comparing signal in response to the third control signal and the reference signal Vlref and to output a fourth comparing signal according to the fourth control signal and the reference signal Vlref.

A second input terminal of the third AND gate circuit 43 is coupled to the falling-edge clock signal B, and an output terminal of the third AND gate circuit 43 is coupled to the third thin film transistor QL1. The third AND gate 43 generates a third switching signal to turn on and turn odd the third thin film transistor QL1 in response to the third comparing signal, fourth comparing signal and falling-edge clock signal B. The third switching signal is transmitted to a third output terminal c of the delay control chip 25.

An output terminal of the second NOT gate circuit 44 is coupled to a first input terminal of the fourth AND gate circuit 45. The third comparing signal is inverted to the fourth comparing signal by means of the second NOT gate circuit 44.

A second input terminal of the fourth AND gate circuit 45 is coupled to the falling-edge clock signal B, and an output terminal of the fourth AND gate circuit 45 is coupled to the fourth thin film transistor QL2. The fourth AND gate circuit 45 is configured to generate a fourth switching signal to turn on and turn off the fourth thin film transistor QL2 according to the third comparing signal and the fourth comparing signal inverted to the third comparing signal. The fourth switching signal is transmitted to a fourth output terminal d of the delay control chip 25.

Figure 5:
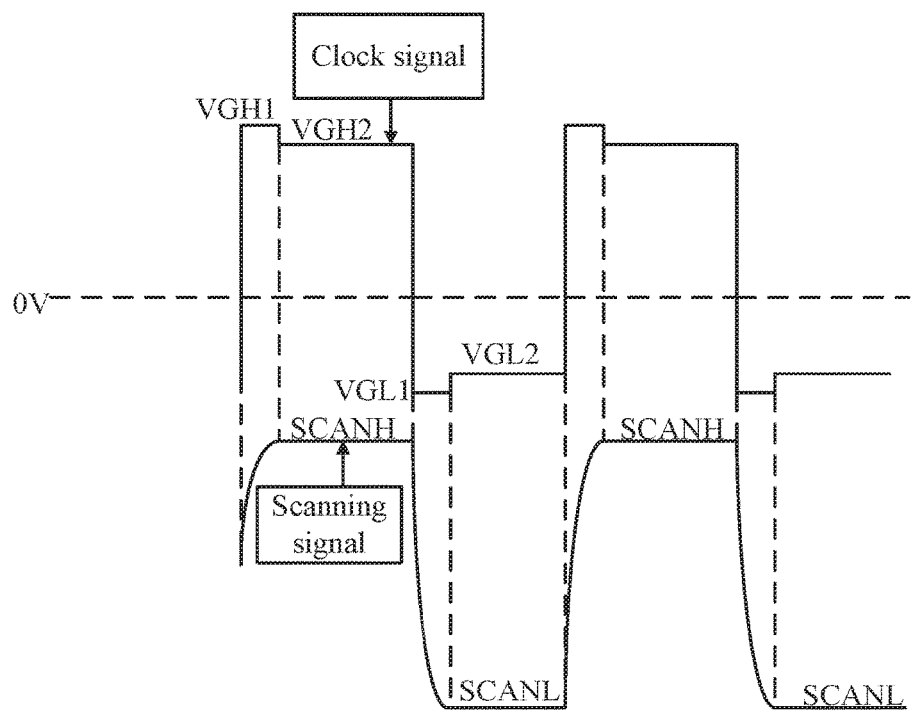
FIG. 5 illustrates waveforms of scanning signal and clock signal.

The operation of the voltage level conversion circuit according to the present disclosure is disclosed with reference to FIGS. 2-5 as follows. FIG. 5 illustrates waveforms of scanning signal and clock signal.

Before the scanning signal applied to the display panel transits to high voltage level SCANH which corresponds to the second voltage VGH2 of the clock signal, the clock signal is transited to the first voltage level VGH1 be means of the voltage level conversion circuit 20.

The first delay control circuit 31 of the first delay circuit 30 generates the first control signal at rising edge of the clock signal. The first comparator 32 outputs the first comparing signal according to the first control signal and the reference signal Vhref.

The first AND gate circuit 33 generates the first switching signal with low voltage level to the first thin film transistor QH1 according to the first comparing signal and the rising-edge clock signal A.

The first NOT gate circuit 34 performs NOT operation on the first comparing signal. The second AND gate circuit 35 generates the second switching signal with high voltage level to the second thin film transistor QH2 according to the first comparing signal and the rising-edge clock signal A.

At the moment, the first thin film transistor QH1 turns on so that the first voltage level VGH1 is conducted to the voltage level conversion output terminal Sig_out via the first thin film transistor QH1. The second thin film transistor QH2 turns off.

The voltage level conversion circuit 20 transits the scanning signal to the second high voltage level VGH2.

The first delay control circuit 31 of the first delay circuit 30 generates the second control signal. The polarity of the second control signal should be opposite to the polarity of the first control signal. Subsequently, the first comparator 32 outputs the second comparing signal according to the second control signal and the reference signal Vhref.

The first AND gate circuit 33 generates the second switching signal with high voltage level to the first thin film transistor QH1 according to the second comparing signal and the rising-edge clock signal A.

The first NOT gate circuit 34 performs NOT operation on the second comparing signal. The second AND gate circuit 35 generates the first switching signal with low voltage level to the second thin film transistor QH2 according to the second comparing signal and the rising-edge clock signal A.

At the moment, the second thin film transistor QH2 turns on so that the second voltage level VGH2 is conducted to the voltage level conversion output terminal Sig_out via the second thin film transistor QH2. The first thin film transistor QH1 turns off.

Because the clock signal is transited from the first voltage level VGH1 to the second voltage level VGH2, which is lower, the transition speed of the second voltage level VGH2 is greater and the transition accuracy of the second voltage level VGH2 is greater, too.

Before the scanning signal applied to the display panel transits to low voltage level SCANL which corresponds to the fourth voltage VGL2 of the clock signal, the clock signal is transited to the third voltage level VGL1 by means of the voltage level conversion circuit 20.

The second delay control circuit 41 of the second delay circuit 40 generates the third control signal at falling edge of the clock signal. The second comparator 42 outputs the third comparing signal according to the third control signal and the reference signal Vlref.

The third AND gate circuit 43 generates the second switching signal with high voltage level to the third thin film transistor QL1 according to the third comparing signal and the clock signal B.

The second NOT gate circuit 44 performs NOT operation on the third comparing signal. The fourth AND gate circuit 45 generates the first switching signal with low voltage level to the fourth thin film transistor QL2 according to the third comparing signal and the rising-edge clock signal B.

At the moment, the third thin film transistor QL1 turns on so that the third voltage level VGL1 is conducted to the voltage level conversion output terminal Sig_out via the third thin film transistor QL1. The fourth thin film transistor QL2 turns off.

The voltage level conversion circuit 20 transits the scanning signal to the fourth voltage level VGL2.

The second delay control circuit 41 of the second delay circuit 40 generates the fourth control signal. The polarity of the fourth control signal should be opposite to the polarity of the third control signal. Subsequently, the second comparator 42 outputs the fourth comparing signal according to the fourth control signal and the reference signal Vlref.

The third AND gate circuit 43 generates the first switching signal with low voltage level to the third thin film transistor QL1 according to the fourth comparing signal and the rising-edge clock signal B.

The second NOT gate circuit 44 performs NOT operation on the fourth comparing signal. The fourth AND gate circuit 45 generates the second switching signal with high voltage level to the fourth thin film transistor QL2 according to the fourth comparing signal and the rising-edge clock signal B.

At the moment, the fourth thin film transistor QL2 turns on so that the fourth voltage level VGL2 is conducted to the voltage level conversion output terminal Sig_out via the fourth thin film transistor QL2. The third thin film transistor QL1 turns off.

Because the clock signal is transited from the third voltage level VGL1 to the fourth voltage level VGL2, which is higher, the transition speed of the fourth voltage level VGL2 is greater and the transition accuracy of the fourth voltage level VGL2 is greater, too.

In this way, the voltage level conversion process of the scanning signal of the voltage level conversion circuit 20 in the embodiment is completely performed.

The present disclosure further proposes a display panel having a driving circuit. The driving circuit includes a voltage level conversion circuit. The voltage level conversion circuit includes a first voltage level input terminal configured to receive a first voltage level, a second voltage level input terminal configured to receive a second voltage level, a first thin film transistor, a second thin film transistor and a delay control chip. A polarity of the first voltage level is same as a polarity of the second voltage level, and an absolute voltage value of the first voltage level is more than an absolute voltage value of the second voltage level.

An input terminal of the first thin film transistor is coupled to the first voltage level input terminal, an output terminal of the first thin film transistor is coupled to a voltage level conversion output terminal, and a control terminal of the first thin film transistor is coupled to a first output terminal of the delay control chip. An input terminal of the second thin film transistor is coupled to the second voltage level input terminal, an output terminal of the second thin film transistor is coupled to the voltage level conversion output terminal, and a control terminal of the second thin film transistor is coupled to a second output terminal of the delay control chip. The delay control chip is configured to control the voltage level conversion output terminal such that the voltage level conversion output terminal outputs the first voltage level before outputting the second voltage level in a delayed manner.

Optionally, the first voltage level is a first high voltage level, and the second voltage level is a second high voltage level; or the first voltage level is a first low voltage level, and the second voltage level is a second low voltage level.

Optionally, the voltage level conversion circuit includes a first voltage level input terminal configured to receive a first voltage level with a high voltage level, a second voltage level input terminal configured to receive a second voltage level, a third voltage level input terminal configured to receive a third voltage level with a low voltage level, a fourth voltage level input terminal configured to receive a fourth voltage level, a first thin film transistor, a second thin film transistor, a third thin film transistor, a fourth thin film transistor, and a delay control chip.

A polarity of the first voltage level is same as a polarity of the second voltage level, and an absolute voltage value of the first voltage level is more than an absolute voltage value of the second voltage level.

An input terminal of the first thin film transistor is coupled to the first voltage level input terminal, an output terminal of the first thin film transistor is coupled to a voltage level conversion output terminal, and a control terminal of the first thin film transistor is coupled to a first output terminal of a delay control chip. An input terminal of the second thin film transistor is coupled to the second voltage level input terminal, an output terminal of the second thin film transistor is coupled to the voltage level conversion output terminal, and a control terminal of the second thin film transistor is coupled to a second output terminal of the delay control chip.

A polarity of the third voltage level is same as a polarity of the fourth voltage level, an absolute voltage value of the third voltage level is more than an absolute voltage value of the fourth voltage level, and the polarity of the first voltage level is opposite to the polarity of the third voltage level.

An input terminal of the third thin film transistor is coupled to the third voltage level input terminal, an output terminal of the third thin film transistor is coupled to the voltage level conversion output terminal, and a control terminal of the third thin film transistor is coupled to a third output terminal of the delay control chip. An input terminal of the fourth thin film transistor is coupled to the fourth voltage level input terminal, an output terminal of the fourth thin film transistor is coupled to the voltage level conversion output terminal, and a control terminal of the fourth thin film transistor is coupled to a fourth output terminal of the delay control chip.

The delay control chip is configured to control the voltage level conversion output terminal such that the voltage level conversion output terminal outputs the first voltage level before outputting the second voltage level in a delayed manner, and configured to control the voltage level conversion output terminal such that the voltage level conversion output terminal outputs the third voltage level before outputting the fourth voltage level in a delayed manner.

Optionally, the delay control chip comprises a first delay control circuit, a first comparator, a first AND gate circuit, a first NOT gate circuit, and a second AND gate circuit.

The first delay control circuit is configured to, at a rising edge of a clock signal, output a first control signal, and after a first predetermined time period, output a second control signal. A non-inverting input terminal of the first comparator is coupled to an output terminal of the first delay control circuit, an inverting input terminal of the first comparator is coupled to a reference signal, an output terminal of the first comparator is coupled to a first input terminal of the first AND gate circuit, and an input terminal of the first NOT gate circuit. A second input terminal of the first AND gate circuit is coupled to the clock signal, and an output terminal of the first AND gate circuit is coupled to the first thin film transistor. An output terminal of the first NOT gate circuit is coupled to a first input terminal of the second AND gate circuit. A second input terminal of the second AND gate circuit is coupled to the clock signal, and an output terminal of the second AND gate circuit is coupled to the second thin film transistor.

Optionally, the delay control chip comprises a second delay circuit. The second delay circuit comprises a second delay control circuit, a second comparator, a third AND gate circuit, a second NOT gate circuit, and a fourth AND gate circuit.

The second delay control circuit is configured to, at a falling edge of a clock signal, output a first control signal, and after a second predetermined time period, output a second control signal. A non-inverting input terminal of the second comparator is coupled to an output terminal of the second delay control circuit, an inverting input terminal of the second comparator is coupled to a reference signal, an output terminal of the second comparator is coupled to a first input terminal of the third AND gate circuit, and an input terminal of the second NOT gate circuit. A second input terminal of the third AND gate circuit is coupled to the clock signal, and an output terminal of the third AND gate circuit is coupled to the third thin film transistor. An output terminal of the second NOT gate circuit is coupled to a first input terminal of the fourth AND gate circuit. A second input terminal of the fourth AND gate circuit is coupled to the clock signal, and an output terminal of the fourth AND gate circuit is coupled to the fourth thin film transistor.

Optionally, a polarity of the first control signal is opposite to a polarity of the second control signal.

The operation of the display panel is similar to that of the voltage level conversion circuit. Please refer to the description of the voltage level conversion circuit as stated in above embodiment.

In the present disclosure, a plurality of voltage-level inputs and a plurality of delay control chips are arranged in the voltage level conversion circuit and the display panel. The conversion voltage-level voltage is driven at a transition of the voltage level to ensure the accurate voltage-level voltage within the shortest period of time after conversion and increase the speed and accuracy of the voltage-level conversion. In this way, the technical problem that time-delay conversion and conversion voltage bias exist in the converted voltage-level voltage of the converted voltage level conversion circuit and the converted display panel of the related art is solved successfully.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A voltage level conversion circuit, comprising:
a first voltage level input terminal configured to receive a first voltage level;
a second voltage level input terminal configured to receive a second voltage level, wherein a polarity of the first voltage level is same as a polarity of the second voltage level, and an absolute voltage value of the first voltage level is more than an absolute voltage value of the second voltage level;
a first thin film transistor, wherein an input terminal of the first thin film transistor is coupled to the first voltage level input terminal, an output terminal of the first thin film transistor is coupled to a voltage level conversion output terminal, and a control terminal of the first thin film transistor is coupled to a first output terminal of a delay control chip;
a second thin film transistor, wherein an input terminal of the second thin film transistor is coupled to the second voltage level input terminal, an output terminal of the second thin film transistor is coupled to the voltage level conversion output terminal, and a control terminal of the second thin film transistor is coupled to a second output terminal of the delay control chip; and
the delay control chip configured to control the voltage level conversion output terminal such that the voltage level conversion output terminal outputs the first voltage level before outputting the second voltage level in a delayed manner.

2. The voltage level conversion circuit of claim 1, wherein the first voltage level is a first high voltage level, and the second voltage level is a second high voltage level.

3. The voltage level conversion circuit of claim 1, wherein the first voltage level is a first low voltage level, and the second voltage level is a second low voltage level.

4. The voltage level conversion circuit of claim 1, wherein the delay control chip comprises a delay control circuit, a comparator, a first AND gate circuit, a NOT gate circuit, and a second AND gate circuit;
wherein the delay control circuit is configured to, at a rising edge or a falling edge of a clock signal, output a first control signal, and after a predetermined time period, output a second control signal;
wherein a non-inverting input terminal of the comparator is coupled to an output terminal of the delay control circuit, an inverting input terminal of the comparator is coupled to a reference signal, an output terminal of the comparator is coupled to a first input terminal of the first AND gate circuit, and an input terminal of the NOT gate circuit;
wherein a second input terminal of the first AND gate circuit is coupled to the clock signal, and an output terminal of the first AND gate circuit is coupled to the first thin film transistor;
wherein an output terminal of the NOT gate circuit is coupled to a first input terminal of the second AND gate circuit; and
wherein a second input terminal of the second AND gate circuit is coupled to the clock signal, and an output terminal of the second AND gate circuit is coupled to the second thin film transistor.

5. The voltage level conversion circuit of claim 4, wherein a polarity of the first control signal is opposite to a polarity of the second control signal.

6. The voltage level conversion circuit of claim 5, wherein the first control signal is a low voltage level signal, and the second control signal is a high voltage level signal.

7. A voltage level conversion circuit, comprising:
a first voltage level input terminal configured to receive a first voltage level, wherein the first voltage level is a high voltage level;
a second voltage level input terminal configured to receive a second voltage level, wherein a polarity of the first voltage level is same as a polarity of the second voltage level, and an absolute voltage value of the first voltage level is more than an absolute voltage value of the second voltage level;
a third voltage level input terminal configured to receive a third voltage level, wherein the third voltage level is a low voltage level;
a fourth voltage level input terminal configured to receive a fourth voltage level, wherein a polarity of the third voltage level is same as a polarity of the fourth voltage level, an absolute voltage value of the third voltage level is more than an absolute voltage value of the fourth voltage level, and the polarity of the first voltage level is opposite to the polarity of the third voltage level;

a first thin film transistor, wherein an input terminal of the first thin film transistor is coupled to the first voltage level input terminal, an output terminal of the first thin film transistor is coupled to a voltage level conversion output terminal, and a control terminal of the first thin film transistor is coupled to a first output terminal of a delay control chip;

a second thin film transistor, wherein an input terminal of the second thin film transistor is coupled to the second voltage level input terminal, an output terminal of the second thin film transistor is coupled to the voltage level conversion output terminal, and a control terminal of the second thin film transistor is coupled to a second output terminal of the delay control chip;

a third thin film transistor, wherein an input terminal of the third thin film transistor is coupled to the third voltage level input terminal, an output terminal of the third thin film transistor is coupled to the voltage level conversion output terminal, and a control terminal of the third thin film transistor is coupled to a third output terminal of the delay control chip;

a fourth thin film transistor, wherein an input terminal of the fourth thin film transistor is coupled to the fourth voltage level input terminal, an output terminal of the fourth thin film transistor is coupled to the voltage level conversion output terminal, and a control terminal of the fourth thin film transistor is coupled to a fourth output terminal of the delay control chip; and the delay control chip configured to control the voltage level conversion output terminal such that the voltage level conversion output terminal outputs the first voltage level before outputting the second voltage level in a delayed manner, and configured to control the voltage level conversion output terminal such that the voltage level conversion output terminal outputs the third voltage level before outputting the fourth voltage level in a delayed manner.

8. The voltage level conversion circuit of claim 7, wherein the delay control chip comprises a first delay circuit comprising a first delay control circuit, a first comparator, a first AND gate circuit, a first NOT gate circuit, and a second AND gate circuit;

wherein the first delay control circuit is configured to, at a rising edge of a clock signal, output a first control signal, and after a first predetermined time period, output a second control signal;

wherein a non-inverting input terminal of the first comparator is coupled to an output terminal of the first delay control circuit, an inverting input terminal of the first comparator is coupled to a reference signal, an output terminal of the first comparator is coupled to a first input terminal of the first AND gate circuit, and an input terminal of the first NOT gate circuit;

wherein a second input terminal of the first AND gate circuit is coupled to the clock signal, and an output terminal of the first AND gate circuit is coupled to the first thin film transistor;

wherein an output terminal of the first NOT gate circuit is coupled to a first input terminal of the second AND gate circuit; and wherein a second input terminal of the second AND gate circuit is coupled to the clock signal, and an output terminal of the second AND gate circuit is coupled to the second thin film transistor.

9. The voltage level conversion circuit of claim 7, wherein the delay control chip comprises a second delay circuit; wherein the second delay circuit comprises a second delay control circuit, a second comparator, a third AND gate circuit, a second NOT gate circuit, and a fourth AND gate circuit;

wherein the second delay control circuit is configured to, at a falling edge of a clock signal, output a first control signal, and after a second predetermined time period, output a second control signal;

wherein a non-inverting input terminal of the second comparator is coupled to an output terminal of the second delay control circuit, an inverting input terminal of the second comparator is coupled to a reference signal, an output terminal of the second comparator is coupled to a first input terminal of the third AND gate circuit, and an input terminal of the second NOT gate circuit;

wherein a second input terminal of the third AND gate circuit is coupled to the clock signal, and an output terminal of the third AND gate circuit is coupled to the third thin film transistor;

wherein an output terminal of the second NOT gate circuit is coupled to a first input terminal of the fourth AND gate circuit; and wherein a second input terminal of the fourth AND gate circuit is coupled to the clock signal, and an output terminal of the fourth AND gate circuit is coupled to the fourth thin film transistor.

10. The voltage level conversion circuit of claim 7, wherein a polarity of the first control signal is opposite to a polarity of the second control signal.

11. The voltage level conversion circuit of claim 10, wherein the first control signal is a low voltage level signal, and the second control signal is a high voltage level signal.

12. A display panel, comprising a driving circuit, wherein the driving circuit comprises:

a first voltage level input terminal configured to receive a first voltage level;

a second voltage level input terminal configured to receive a second voltage level, wherein a polarity of the first voltage level is same as a polarity of the second voltage level, and an absolute voltage value of the first voltage level is more than an absolute voltage value of the second voltage level;

a first thin film transistor, wherein an input terminal of the first thin film transistor is coupled to the first voltage level input terminal, an output terminal of the first thin film transistor is coupled to a voltage level conversion output terminal, and a control terminal of the first thin film transistor is coupled to a first output terminal of a delay control chip;

a second thin film transistor, wherein an input terminal of the second thin film transistor is coupled to the second voltage level input terminal, an output terminal of the second thin film transistor is coupled to the voltage level conversion output terminal, and a control terminal of the second thin film transistor is coupled to a second output terminal of the delay control chip; and the delay control chip configured to control the voltage level conversion output terminal such that the voltage level conversion output terminal outputs the first voltage level before outputting the second voltage level in a delayed manner.

13. The display panel of claim 12, wherein the first voltage level is a first high voltage level, and the second voltage level is a second high voltage level.

14. The display panel of claim 12, wherein the first voltage level is a first low voltage level, and the second voltage level is a second low voltage level.

15. The display panel of claim 12, wherein the delay control chip comprises a delay control circuit, a comparator, a first AND gate circuit, a NOT gate circuit, and a second AND gate circuit;

wherein the delay control circuit is configured to, at a rising edge or a falling edge of a clock signal, output a first control signal, and after a predetermined time period, output a second control signal;

wherein a non-inverting input terminal of the comparator is coupled to an output terminal of the delay control circuit, an inverting input terminal of the comparator is coupled to a reference signal, an output terminal of the comparator is coupled to a first input terminal of the first AND gate circuit, and an input terminal of the NOT gate circuit;

wherein a second input terminal of the first AND gate circuit is coupled to the clock signal, and an output terminal of the first AND gate circuit is coupled to the first thin film transistor;

wherein an output terminal of the NOT gate circuit is coupled to a first input terminal of the second AND gate circuit; and wherein a second input terminal of the second AND gate circuit is coupled to the clock signal, and an output terminal of the second AND gate circuit is coupled to the second thin film transistor.

16. The display panel of claim 15, wherein a polarity of the first control signal is opposite to a polarity of the second control signal.

17. The display panel of claim 16, wherein the first control signal is a low voltage level signal, and the second control signal is a high voltage level signal.

\* \* \* \* \*